(12) United States Patent
Hu et al.

(10) Patent No.: US 9,419,639 B1
(45) Date of Patent: Aug. 16, 2016

(54) LOW DISTORTION SAMPLE AND HOLD SWITCH

(71) Applicant: QUALCOMM Incorporated, San Diego, CA (US)

(72) Inventors: Weibo Hu, San Diego, CA (US); Wenchang Huang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/973,437

(22) Filed: Dec. 17, 2015

Related U.S. Application Data

(60) Provisional application No. 62/222,656, filed on Sep. 23, 2015.

(51) Int. Cl.
  *H03M 1/00* (2006.01)
  *H03M 1/12* (2006.01)
(52) U.S. Cl.
  CPC .................................. *H03M 1/1245* (2013.01)
(58) Field of Classification Search
  CPC .... H03M 1/1245; G11C 27/02; G11C 27/024
  USPC ......... 341/122, 155; 327/88, 91, 94, 390, 589
  See application file for complete search history.

(56) References Cited

U.S. PATENT DOCUMENTS

| | | | | |
|---|---|---|---|---|
| 6,072,355 A | * | 6/2000 | Bledsoe | H03K 17/063 326/88 |
| 6,323,697 B1 | | 11/2001 | Pavan | |
| 6,525,574 B1 | * | 2/2003 | Herrera | G11C 27/02 327/589 |
| 8,115,518 B1 | | 2/2012 | Ali | |
| 8,248,282 B2 | * | 8/2012 | Payne | H03M 1/08 341/122 |
| 8,525,574 B1 | * | 9/2013 | Duggal | H03K 17/063 327/390 |
| 8,664,979 B2 | | 3/2014 | Doris et al. | |

OTHER PUBLICATIONS

Sameer R et al., "A Low Distortion MOS Sampling Circuit," IEEE ISCAS, vol. 5, pp. V-585-V-588, May 2002.
Xubin Z., et al., "A 10-bit 50-MS/s sample-and-hold circuit with low distortion sampling switches", Journal of Semiconductors, May 2009, vol. 30, No. 5, pp. 055011-1-055011-4.

\* cited by examiner

*Primary Examiner* — Khai M Nguyen
(74) *Attorney, Agent, or Firm* — Procopio, Cory, Hargreaves & Savitch, LLP

(57) ABSTRACT

Devices and methods for analog to digital conversion are provided. The device can have a supply voltage coupled to a bootstrap circuit operable to provide a boosted voltage during a first period defined by a sample phase (Ps) signal and a hold phase (Ph) signal. The device can also have a sampling circuit having an input node and operable to sample an input signal supplied to the input node. The device can also have a switching circuit having a first switch and a second switch. The switching circuit can be coupled to the bootstrap circuit and to the sampling circuit. The switching circuit can be configured to isolate the input node from shorting currents to the supply voltage for a portion of the first period.

30 Claims, 5 Drawing Sheets

LOW DISTORTION SAMPLE AND HOLD SWITCH

CROSS REFERENCE TO RELATED APPLICATIONS

This application claims benefit to U.S. Provisional Application 62/222,656, entitled "LOW DISTORTION SAMPLE AND HOLD SWITCH," filed on Sep. 23, 2015, the entirety of which is hereby incorporated by reference herein.

BACKGROUND

1. Technological Field

This disclosure relates to encoder-decoder (CODEC) and analog to digital converter (ADC) circuitry. More specifically, this disclosure relates to reducing the effect of harmonics in high-resolution ADCs.

2. Related Art

A variety of electrical and electronic components implement ADCs. An ADC is a device configured to convert a physical quantity to a digital number. Such conversion can be accomplished with an analog voltage or signal, creating a discrete number representative of the voltage or signal amplitude. The conversion involves quantization of the input, so the ADC necessarily introduces a small amount of error into the digital output. However, as opposed to conducting a single conversion, an ADC often performs the conversions periodically by "sampling" the analog input. The result is a sequence of digital values that are converted from a continuous-time and continuous-amplitude analog signal to a discrete-time and discrete-amplitude digital signal.

In some examples, ADCs can implement numerous N-type or P-type Metal Oxide (NMOS, PMOS) devices. These can be Field Effect Transistors (FET), for example. The NMOS or PMOS devices (MOS devices) can be used as switches to conduct sampling of the analog signal while also holding the sampled value for a time. Accordingly, the MOS devices may also be referred to herein as "switches." ADCs can also implement several digital signals, or clocks, to activate and deactivate the switches according to sample or hold requirements. Depending on the clock cycles and specific circuitry of the ADCs, leakage or shorting currents can result, detrimentally affecting resolution of the ADC.

SUMMARY

In general, this disclosure describes systems and methods related to reducing harmonics and transient voltage errors in high-resolution analog to digital converters. The systems, methods, and devices of this disclosure each have several innovative aspects, no single one of which is solely responsible for the desirable attributes disclosed herein.

One aspect of the disclosure provides a device for analog to digital conversion having a supply voltage. The device can have a bootstrap circuit can provide a boosted voltage during a first period defined by a sample phase (Ps) signal and a hold phase (Ph) signal. The device can also have a sampling circuit having an input node. The switching circuit can sample an input signal supplied to the input node. The device can also have a switching circuit having a first switch and a second switch. The switching circuit can be operably coupled to the bootstrap circuit and to the sampling circuit. The switching circuit can isolate the input node from the supply voltage for a portion of the first period.

Another aspect of the disclosure provides a method for analog to digital conversion in a sample and hold circuit having a supply voltage. The method can include receiving a sample phase (Ps) signal and a sample hold (Ph) signal at a bootstrap circuit, the Ps signal and the Ph signal defining a first period. The method can also include providing, by the bootstrap circuit, a boosted voltage to a sampling circuit based on the first period. The method can also include isolating, with a switching circuit, an input node of the sampling circuit from shorting currents to the supply voltage for a portion of the first period.

Another aspect of the disclosure provides an apparatus for analog to digital conversion having a supply voltage. The apparatus can have means for receiving a sample phase (Ps) signal and a sample hold (Ph) signal, the Ps signal and the Ph signal defining a first period. The apparatus can also have means for sampling a filtered signal based at least in part on the first period. The apparatus can also have means for providing a boosted voltage to the means for sampling based on the first period. The apparatus can also have means for isolating an input node of the means for sampling from shorting currents to the supply voltage for a portion of the first period based on a second period.

Another aspect of the disclosure provides a device for sampling one or more signals and having a supply voltage. The device can have a sampling circuit configured to sample one or more filtered signals received at one or more input nodes of the sampling circuit, the sampling circuit having one or more sampling switches configured to receive a boosted voltage, a number of the one or more sampling switches being equal to a number of the one or more filtered signals. The device can have one or more bootstrap circuits operably coupled to the supply voltage and to the one or more switches, the one or more bootstrap circuits configured to provide a boosted voltage to the one or more sampling switches based on a first period defined by a sample phase (Ps) signal and a sample hold (Ph) signal. The device can have one or more switching circuits operably coupled to the one or more bootstrap circuits and the one or more input nodes, the one or more switching circuits configured to isolate the one or more input nodes from shorting currents to the supply voltage for a second period shorter than the first period, the second period being defined by an early sample phase (Pse) signal and an early hold phase (Phe) signal.

Other features and advantages of the present disclosure should be apparent from the following description which illustrates, by way of example, aspects of the disclosure.

BRIEF DESCRIPTION OF THE FIGURES

The details of embodiments of the present disclosure, both as to their structure and operation, may be gleaned in part by study of the accompanying drawings, in which like reference numerals refer to like parts, and in which.

DETAILED DESCRIPTION

Figure 1:
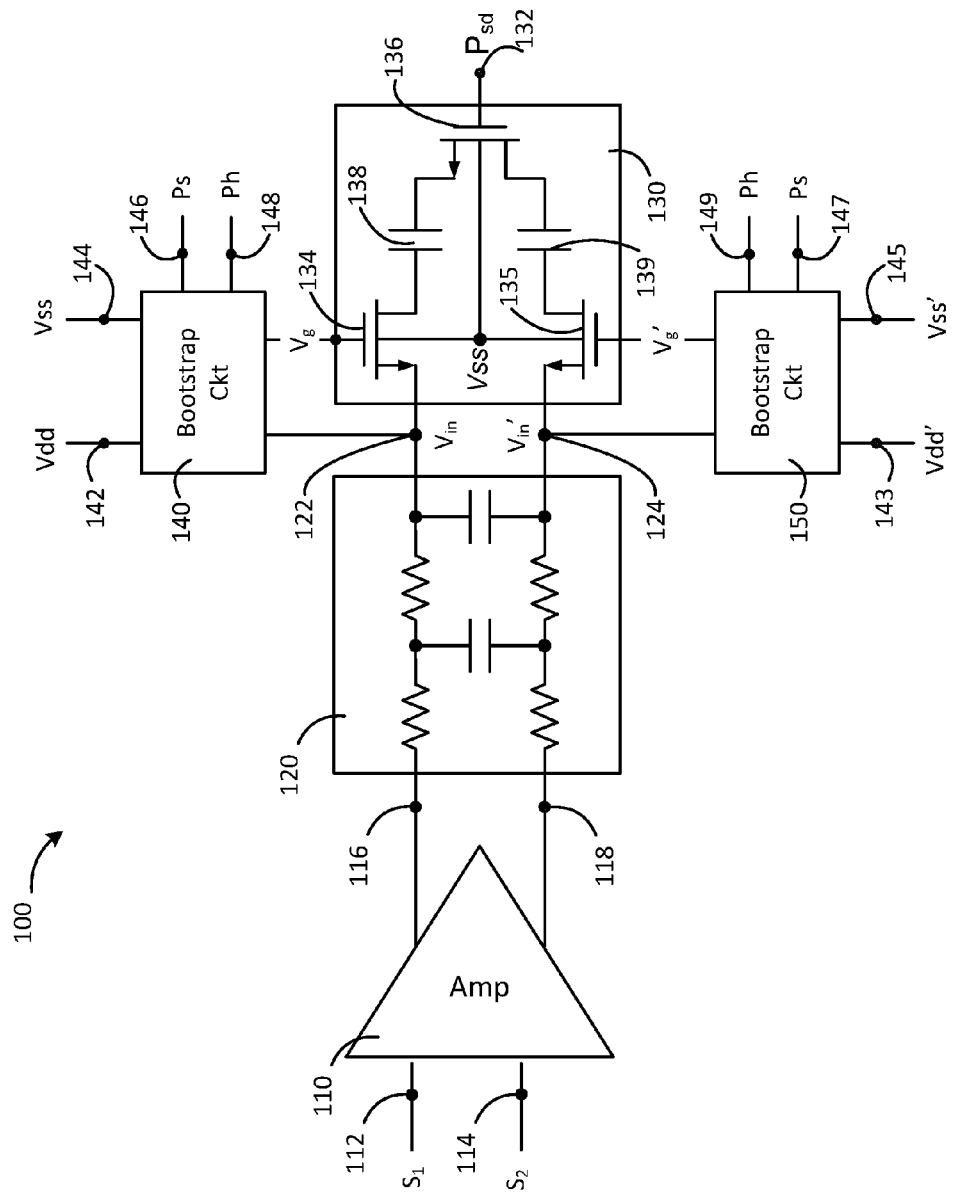
FIG. 1 is a schematic diagram of an embodiment of a sample and hold circuit.

The detailed description set forth below, in connection with the accompanying drawings, is intended as a description of various embodiments and is not intended to represent the only embodiments in which the disclosure may be practiced. The detailed description includes specific details for providing a thorough understanding of the embodiments. However, it will be apparent to those skilled in the art that the disclosure without these specific details. In some instances, well-known structures and components are shown in simplified form for brevity of description. As used herein, like reference numerals refer to like features throughout the written description.

FIG. 1 is a schematic diagram of an embodiment of a sample and hold circuit. A sample and hold circuit 100 (hereinafter, circuit 100) can sample a signal or data, retain or hold the sampled value and output a discrete time value. The circuit 100 can have an amplifier 110 having one or more inputs 112, 114. The inputs 112, 114 can receive, for example, power supply or temperature signal values for a component in an integrated circuit (IC) or other electrical or electronic system that requires monitoring. The circuit 100 can be used to monitor an audio power supply or temperature in an IC, for example. The amplifier 110 can have outputs 116, 118 that provide an amplified version of the signal(s) to be sampled. Two outputs 116, 118 are shown, but this should not be considered limiting. The amplifier 110 can output at least as many signals present at the inputs 112, 114. In some embodiments, only a single input (e.g., the input 112) may be present.

The circuit 100 can also have an anti-aliasing filter (AAF) 120 coupled to the amplifier 110. The AAF 120 can be a filter used within a sampling circuit (e.g., the circuit 100) to prevent aliasing of two different signals S1, S2. Aliasing can cause two or more different signals (e.g., the signals S1, S2 at the inputs 112, 114) to become indistinguishable, or aliases of one another, when sampled. This can be a primary concern when reconstructing originals signals from the samples. In some examples, the two different signals can be reconstructed from the same set of samples.

The AAF 120 can restrict the bandwidth of a signal (e.g., at the output 116 and the output 118) to approximately or completely satisfy the Shannon-Nyquist sampling theorem over the band of interest to reduce or eliminate aliasing. In some embodiments, the AAF 120 can be a low pass filter. In some other embodiments, the AAF 120 can be a band pass filter. In some embodiments, the AAF 120 can permit some aliasing to occur or alternatively, attenuate some in-band frequencies close to the Nyquist limit. Accordingly, the circuit 100 can oversample the signals received at the input 112 and the input 114 to ensure all of the frequencies of interest can be reconstructed. The AAF 120 can then output a one or more filtered signals Vin and Vin' at node 122 and node 124, respectively. In some embodiments this can also be referred to as a filtered output of the AAF 120 at the nodes 122, 124. For convenience of description, the signal Vin at the node 122 is primarily used for this description. A similar signal Vin' can also be present at the node 124. The signal Vin can be an amplified (by amplifier 110) and filtered (by the AAF 120) version of the signal S1. Similarly, the signal Vin' can be an amplified and filtered version of the signal S2. As used herein, the term node generally refers to an electrical node or point of connection or input/output of an electrical circuit.

The circuit 100 can also have a sampling circuit 130. The sampling circuit 130 can be operably coupled to the AAF 120. The sampling circuit 130 can be configured to sample the one or more filtered signals (e.g., the signal Vin and the signal Vin') at the node 122 and the node 124 from the AAF 120. In some examples, the sampling circuit 130 can be a portion of a larger circuit, such as, for example, a high resolution ADC.

In some examples, the sampling circuit 130 can have multiple sampling switches 134, 135, 136 (e.g., NMOS and PMOS devices). When open, the sampling switch 134 can pass the filtered signals (e.g., the signals Vin, Vin') from the node 122 and the node 124 to respective capacitors 138, 139. In some embodiments, the capacitors 138, 139 can be referred to as sampling capacitors as they can retain the sampled voltage when the respective sampling switch 134, 135 closes. As the sampling switches 134, 135 open, the filtered signals Vin, Vin' from the node 122 and the node 124 can charge the capacitors 138, 139, respectively. As the sampling switch 134 and the sampling switch 135 are closed, the capacitors 138, 139 can retain the charged state as a sample of the respective filtered signals Vin and Vin' from the node 122 and the node 124. The sampling circuit 130 can also have a switch 136. The switch 136 operates in conjunction with the sampling switch 134, 135 and the capacitors 138, 139 to retain the sampled value. In some examples, the output of the sampling circuit 130 can be the voltage sampled at the capacitors 138, 139. The sampled voltages at the capacitors 138, 139 can then be used by other portions of the larger ADC circuit.

The circuit 100 can further have a bootstrap circuit 140 and a bootstrap circuit 150. The bootstrap circuit 140 and the bootstrap circuit 150 can be operably coupled to the sampling circuit 130 and the AAF 120. For convenience of description, the bootstrap circuit 140 will primarily discussed. The features and connections of the bootstrap circuit 150 to the rest of the circuit 100 can be the same or similar to the bootstrap circuit 140.

In some embodiments, the bootstrap circuit 140 can be implemented within or as a portion of the circuitry of the sampling circuit 130. The bootstrap circuit 140 may also be referred to herein as a charge pump or booster circuit. The bootstrap circuit 140 can be a type of converter (e.g., DC to DC) that can use one or more capacitors as energy storage elements to create either a higher or lower voltage power source. The higher or boosted voltage can be supplied based on one or more clock signals, described below. The higher voltage source can be useful in the sample and hold aspect of the sampling circuit 130.

The bootstrap circuit 140 can have one or more inputs 142, 144. The inputs 142, 144 can be configured to receive, for example, Vdd and Vss, as shown. The Vdd can be representative of a supply or supply rail voltage. In some embodiments, Vdd at the input 142 is representative of the positive supply voltage. Accordingly, the Vss at the input 144 can be grounded. In some embodiments, Vss can be a negative voltage supply or a positive voltage supply that is lower than Vdd.

The bootstrap circuit 140 can output a boosted voltage Vg. As used herein, the bootstrap circuit 140 supplies the boosted voltage Vg when it is turned on or otherwise enabled. The boosted voltage Vg can be provided to the sampling switch 134 to a sampling portion of the sampling circuit 130. In some embodiments, the sampling switch 134 can be a NMOS device as shown. In some other embodiments, a PMOS device can also be used.

The bootstrap circuit 140 can provide the boosted voltage Vg according to a cycle, or clock. In some examples, the bootstrap circuit 140 can have clock inputs 146, 148 for controlling the output of the boosted voltage Vg. As shown, the clock input 146 can receive a sample phase (Ps) signal. Similarly, the clock input 148 can receive a hold phase (Ph) signal. The Ps signal and the Ph signal can be non-overlapping clock signals that control activation of the bootstrap circuit 140 and application of the boosted voltage, Vg. The sampling switch 134 can therefore open and close according to the Ps and Ph signals (FIG. 3) and the application (or removal) of the boosted voltage, Vg. Thus, by extension the Ps signal and the Ph signal can control the sample and hold function of the circuit 100. As used herein, the "non-overlapping" signals refer to two signals, or clocks that are both clocks are never equal to one at the same time, but can be both equal to zero for only a short time interval. As described below in connection with FIG. 2, Ps signal and Ph signal fit such a description.

The boosted voltage Vg supplied to the sampling switch 134 can be a boosted version of the rail voltage Vdd. In some embodiments, the voltage Vg is a boosted by a percentage and can be as high as two times the values of Vdd. In some other embodiments, the boosted voltage Vg can be two or more times the Vdd at the input 142, for example. In some other examples, the boosted voltage Vg can be the value of the input voltage of the filtered signal Vin (e.g., at the node 122) plus the rail voltage Vdd. Thus, the voltage different between Vg and Vin remains constant at the value of the rail voltage Vdd. In some examples this can improve switch linearity.

In some embodiments, the boosted voltage Vg at the sampling switch 134 can then open the sampling switch 134 causing the sampling circuit 130 to sample the filtered signal S1 at the node 122 (or the signal S2 at the node 124). In general, due to the transconductance from drain to source of the sampling switch 134, the higher the voltage experienced at the gate of the sampling switch 134, the smaller the input resistance becomes. Additionally, the higher the value of the boosted voltage Vg, the more current will be induced though the sampling switch 134. In some examples, the application and removal of the boosted voltage Vg can lead to higher efficiently of the sampling switch 134 as it is opened and closed.

In some examples, the two clocks the Ps signal (sample phase) and the Ph signal (hold phase) can control the delivery of the boosted voltage Vg (via the bootstrap circuit 140) to the sampling circuit 130. By extension the Ps signal and the Ph signal then can also control the sample and hold functions of the circuit 100. The switch 136 can have an input 132 configured to receive a delayed sample phase signal (Psd signal). The delayed Psd signal can be similar to the Ps signal, but delayed in time by a short time.

In some embodiments, the circuit 100 can have the bootstrap circuit 150. The second bootstrap circuit 150 can be operably coupled to the sampling circuit 130 at the node 124 and the AAF 120 at the sampling switch 135. The second bootstrap circuit 150 can serve a similar purpose as the bootstrap circuit 140 and receive a signal Vin' (similar to the Vin) at the node 124 and a boosted voltage Vg' (similar to the boosted voltage Vg) at the sampling circuit 130.

In some embodiments, the bootstrap circuit 150 can have one or more inputs 143, 145. The inputs 143, 145 can be configured to receive, for example, Vdd' and Vss', as shown. Vdd' and Vss' can be similar to Vdd and Vss above. Vdd' can be representative of a supply or rail voltage. In some embodiments, Vdd' at the input 143 is representative of the positive supply voltage. Accordingly, the Vss' at the input 145 can be grounded. In some embodiments, Vss' can be a negative voltage or a positive voltage that is lower than Vdd'. In some embodiments, Vdd is equal to Vdd'. In some embodiments, Vss is equal to Vss'.

The bootstrap circuit 150 can output the boosted voltage Vg'. Similar to the bootstrap circuit 140, the bootstrap circuit 150 supplies the boosted voltage Vg when it is turned on or otherwise enabled. The boosted voltage Vg' can be provided to the sampling switch 135 of the sampling circuit 130. Similar to the sampling switch 134, the sampling switch 135 can be a NMOS device as shown. In some other embodiments, a PMOS device can also be used.

Similar to above, the bootstrap circuit 150 can provide the boosted voltage Vg' according to a cycle according to a Ps' signal and a Ph' signal. The bootstrap circuit 150 can have a clock input 147 for receiving the single Ps' and an input 149 for receiving the Ph' signal. In general, the characteristics of the bootstrap circuit 140 described herein are also applicable to the bootstrap circuit 150.

Embodiments implementing the boot strap circuits 140, 150 can enable the circuit 100 to sample both the signal S1 and the signal S2 concurrently. In some embodiments, more than the two signals S1, S2 can be concurrently sampled using the bootstrap circuits 140, 150. In some embodiments, a bootstrap circuit (e.g., the bootstrap circuits 140, 150) can be present for each signal sampled (e.g., the signals S1, S2). In some other embodiments, only a single signal (e.g., the signal S1) and signal bootstrap circuit (e.g., the bootstrap circuit 140) may be present.

The second bootstrap circuit 150 can receive the Ps' signal and the Ph' signal to control the boosted voltage Vg' at the sampling switch 135. In some embodiments, the Ps signal can be the same as the Ps' signal. In some embodiments, the Ph signal can be the same as the Ph' signal.

When the boosted voltage Vg is high, or "on," the sampling switch 134 and the sampling switch 135 are then open or turned "on." This allows the filtered signal Vin to charge the capacitor 138. The filtered signal Vin' can then also charge the capacitor 139. When the voltage Vg is then driven low by the Ps signal and the Ph signal, the sampling switch 134 is closed, or turned "off," removing the filtered signal Vin and allowing the capacitor 138 to "hold" the sampled value. When the boosted voltage Vg' is low in response to the Ps' signal and the Ph' signal, the sampling switch 135 is also turned "off."

In certain examples, however, as the sampling switches 134, 135 turn off based on the removal of the boosted voltage Vg (or Vg'), the boosting circuit (e.g., the bootstrap circuit 140) can generate shorting currents from Vdd and Vss (e.g., ground (GND)) to the input signals (e.g., the signals S1, S2). The shorting currents can cause distortion and degrade the resolution of the ADC.

Figure 2:
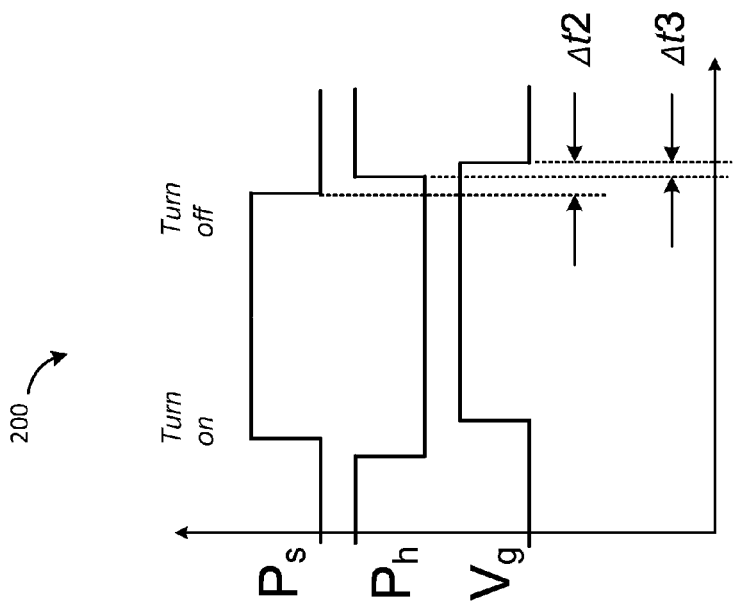
FIG. 2 is a timing diagram of exemplary control signals plotted over time.

FIG. 2 is a timing diagram of exemplary control signals plotted over time. In particular, a timing diagram 200 shows the Ps signal, the Ph signal, and the boosted voltage Vg plotted versus time (t), on the horizontal (x) axis. The timing diagram is also representative of the boosted voltage Vg' and the Ps' signal and the Ph' signal. The signals Ps and Ph will be used primarily for the description, however the details also apply the Ps' and Ph' signals.

In some examples, the Ps and Ph signals can be non-overlapping signals, as shown. In particular, the Ps signal can turn on when the Ph signal turns off and vice versa. In some embodiments, the Ps signal can turn on a short time after the Ps signal turns off. The boosted voltage Vg is then supplied when the Ps signal is high or "on," and the Vg is zero when the Ps signal is low and a short time after the Ph signal is on. The Ps signal and the Ph signal are non-overlapping clock signals. As shown, the Ps signal turns on after the Ph signal turns off. Similarly, the Ph signal turns on after the Ps signal turns off. Accordingly, the Ps signal and the Ph signal have opposing values for the majority of the cycle. The Ps signal and the Ph signal can both be low for a short time, however the Ps signal and the Ph signal are never high (e.g., "on") at the same time as they are non-overlapping "on" signals. The "turn on" and "turn off" points are labeled on the diagram 200 and refer to the activation and deactivation of the sampling switch 134 and the sampling switch 135 (FIG. 1).

In some examples, however, the difference between the duty cycles of the Ps signal, the Ph signal, and the boosted voltage Vg can negatively affect the functioning of the high resolution ADC. A time period between the falling edge of the Ps signal and the falling edge of the boosted voltage Vg is labeled time delta two (Δt2). Similarly, the time period between rising edge of the Ph signal and the falling edge of the boosted voltage Vg is labeled time delta three (Δt3). During the time Δt2, the Ps signal is low and the boosted voltage Vg is high. This can cause the filtered signal Vin at the node 122 to short to the supply voltage Vdd via the bootstrap circuit 140. During the time Δt3, the Ph signal is high and the boosted voltage Vg is high. This situation can cause the filtered signal Vin at the node 122 to short to ground, or Vss, via the bootstrap circuit 140. In a similar manner, the filtered signal Vin' can short to Vss or Vdd via the bootstrap circuit 150 during the same periods of time. While the times Δt2 and Δt3 can be on the order of just a few nanoseconds (ns) to a few microseconds (μs) (e.g., 100 ns-4 μs), the voltage irregularities generated in the boosted output voltage Vg can reduce the resolution of the sampling circuit 130 and the circuit 100 as depicted in FIG. 3.

Figure 3:
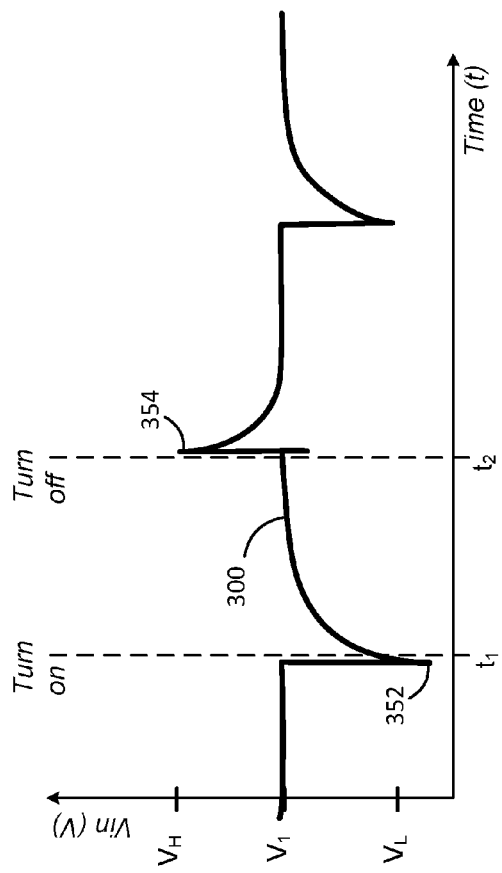
FIG. 3 is a graphical representation of the voltage over time at the input of the sampling circuit of FIG. 1.

FIG. 3 is a graphical representation of the voltage over time at the input of the sampling circuit of FIG. 1. A plot 300 shows the filtered signal Vin at the node 122 depicted on the vertical (y) axis in volts. Time (t) is depicted on the horizontal (x) axis. The plot 300 depicts the effect of the shorting current from the input 112 to Vdd during Δt2 and the shorting current from the input 112 to Vss during Δt3 as measured at the node 122 (FIG. 1). The plot 300 can also be representative of the filtered signal Vin' at the node 124 and a similar short from the input 114 to Vdd'.

The plot 300 depicts a negative spike in the value of Vin at a point 352 coincident with the "turn on" point at time $t_1$. The negative spike at point 352 can have a value $V_L$. In some examples, this is the point at which the boosted voltage Vg/Vg' is turned on and of the respective sampling switches 134, 135 (FIG. 1) are activated. The negative spike at the point 352 is due to onset of the sampling process and may not have a significant effect on sampling or the resolution of the ADC.

The plot 300 further depicts a positive voltage spike at a point 354. The positive voltage spike is associated with the "turn off" point at time $t_2$ and the times Δt2 and Δt3 (FIG. 2). The "turn off" point labeled on the plot 300 coincides with the same "turn off" point in the diagram 200. The "turn off" point can be associated with the removal of the boosted voltage Vg/Vg' and the deactivation of the sampling switches 134, 135. The "turn off" point is also associated with the times Δt2 and Δt3 of the diagram 200.

The positive voltage spike in the filtered signal Vin at a point 354 can result from the shorting currents occurring during the times Δt2 and Δt3 (FIG. 2) that can degrade the resolution of the ADC. The positive voltage spike at the point 354 is actually a mixed transient voltage that has an average positive value $V_H$. In some examples, during the time Δt2, the signal Vin at the node 122 experiences a positive spike at the "turn off" point, resulting when the Ps signal is low and the boosted voltage Vg is high. Similarly, during the time Δt3, the filtered signal Vin at the node 122 experiences a negative voltage spike at the "turn off" point. The positive spike at the time Δt2 is greater than the negative voltage spike at the time Δt3, thus the resulting (average) voltage spike at the point 354 (and the "turn off" point) is positive. The positive spike at the point 354 and the negative spike at point 352 cannot be mutually canceled since they are generated from different electrical paths within the bootstrap circuits 140, 150. In some examples, the voltage spike at the point 354 can be approximately positive 0.15 volts.

In an ideal circuit (e.g., the circuit 100 without the shorting currents to Vdd and Vss), the filtered signal Vin would remain close to a constant voltage $V_1$ at the turn-off moment at the point 354. Therefore, minimizing the shorting currents is beneficial.

Figure 4A:
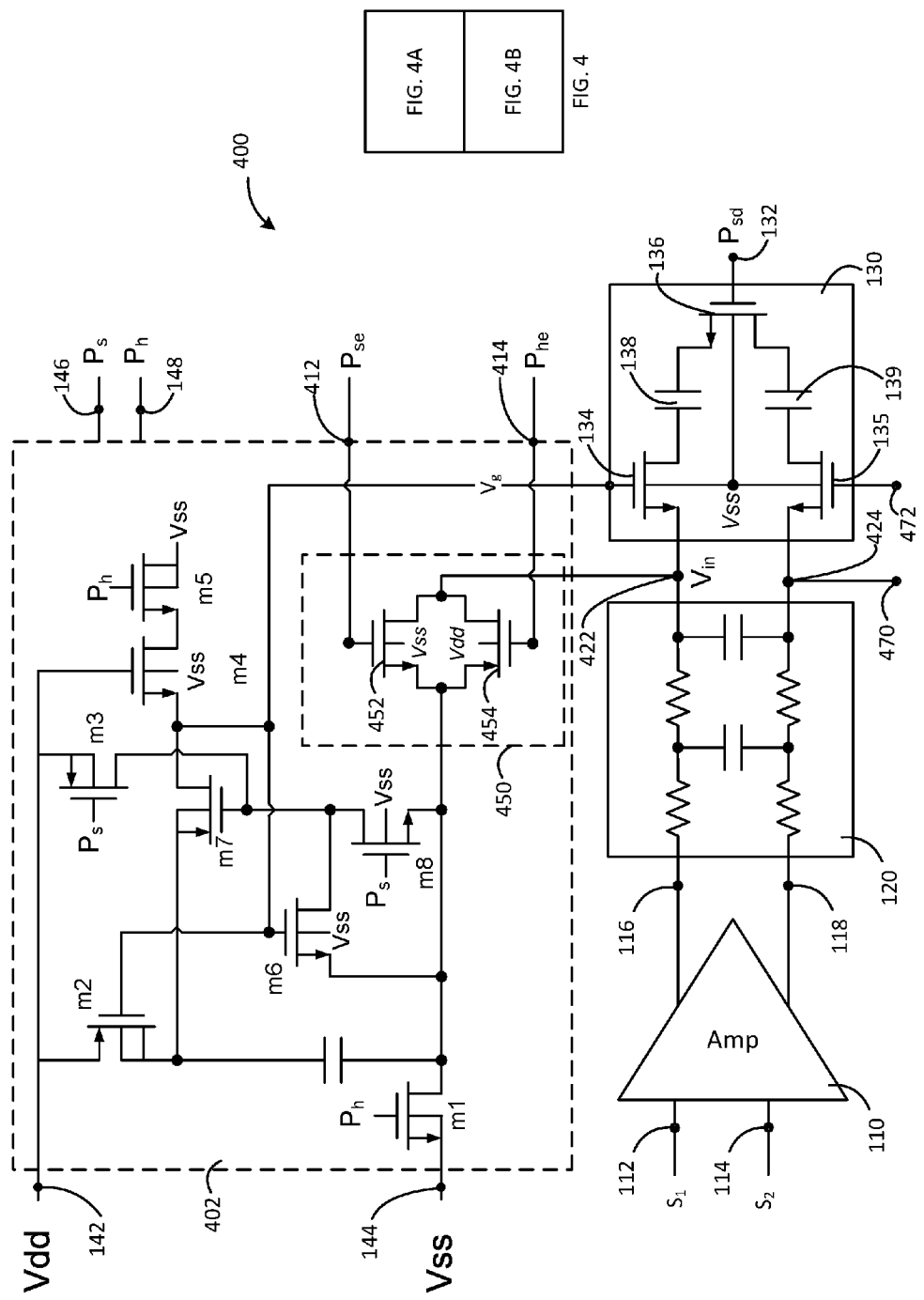
FIG. 4 is a schematic diagram of another embodiment of a sample and hold circuit, split over drawing sheets labeled FIG. 4A and FIG. 4B.
Figure 4B:
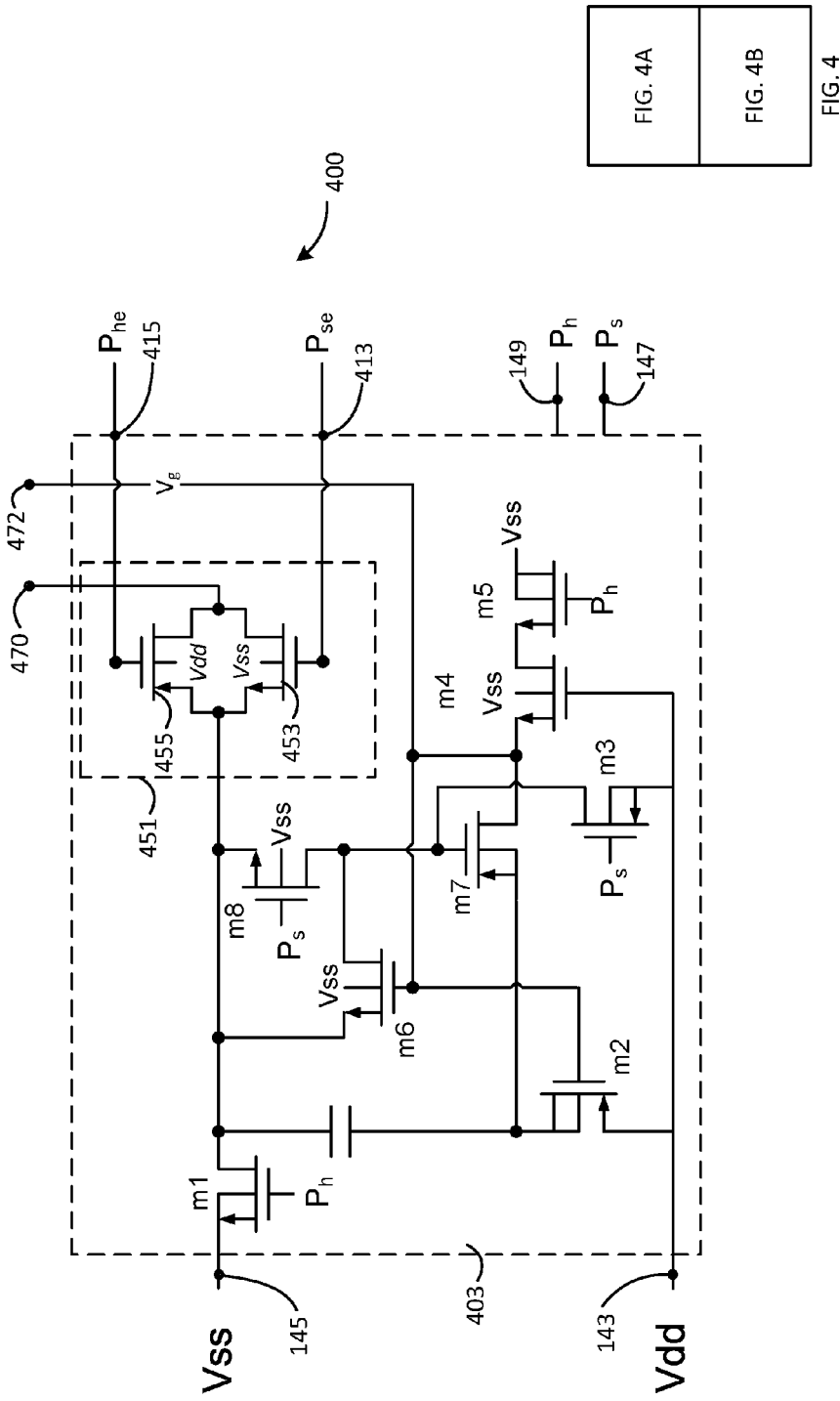

FIG. 4 is a schematic diagram of another embodiment of a sample and hold circuit. FIG. 4 is split into two sheets labeled FIG. 4A and FIG. 4B but both sheets will be described in conjunction as FIG. 4. A sample and hold circuit (circuit) 400 can have the amplifier 110, the AAF 120, and the sampling circuit 130, similar to or the same as that described in connection with FIG. 1.

The circuit 400 can also have a bootstrap circuit 402. The circuit 400 can also have a bootstrap circuit 403. The bootstrap circuits 402, 403 can have a similar purpose as the bootstrap circuits 140, 150 providing a boosted voltage (e.g., Vg, Vg') to the sampling circuit 130. The bootstrap circuit 402 is used herein as a primary example, however the description can apply equally to the bootstrap circuit 403.

In some embodiments, the bootstrap circuit 402 can have a series of switches labeled m1 through m8. The switches m1-m8 can be a series of PMOS and NMOS devices configured to provide the boosted voltage Vg to the sampling circuit 130, as described above. The bootstrap circuit 402 can further have the inputs 142, 144 as in FIG. 1, operable to receive the supply voltage Vdd and the ground, or Vss. The bootstrap circuit 402 can also have the inputs 146, 148 operable to receive the Ps signal and the Ph signal for operation of the sampling switch 134 via the series of switches m1-m8. The Ps signal and the Ph signal are both distributed as control signals throughout the bootstrap circuit 402 for control of the individual switches m1-m8. The specific connections of the Ps signal and the Ph signal are not shown for brevity but are indicated at the gates or body terminals of their respective switches m1-m8.

The bootstrap circuit 402 can also have a switching circuit 450. The switching circuit 450 is shown in dashed lines and is disposed between the bootstrap circuit 402 and a portion of the sampling circuit 130. The switching circuit 450 can have a pair of transistors, referred to herein as switches 452, 454. The switches 452, 454 can also be referred to as a first switch 452 and a second switch 454. The switches 452, 454 can be an NMOS device 452 and a PMOS device 454, for example. In some embodiments, the switches 452, 454 and the types of switches can be reversed or modified as needed. In still other embodiments, the switching circuit 450 can have more than two transistors as required. In some embodiments, the switching circuit 450 can comprise a portion of the circuitry of the bootstrap circuit 402 and the sampling circuit 130.

As described above in connection with FIG. 2, certain shorting currents can be present to Vdd and Vss at the times Δt2 and Δt3. The shorting currents can result from the sequence in which the switches m1-m8 are opened and closed. For example, in the absence of the switching circuit 450, the shorting current from Vdd to Vin during the time Δt2 (FIG. 2) can flow from the input 142 (Vdd) through switch m3 and switch m6 to the node 422 (Vin). Similarly, the shorting current from Vin to Vss during the time Δt3 can flow from the node 422 (Vin) via switch m1 to the input 144 (Vss). Thus, the switching circuit 450 can be used to couple and decouple the bootstrap circuit 402 from the node 422 selectively isolating the filtered signal Vin at the node 422 from such shorting currents to the input 142 (Vdd) and the input 144 (Vss). This is described in detail in the following.

In some embodiments, the sources of the switches 452, 454 can be coupled to the bootstrap circuit 402 (e.g., at the source of switch m8). Further, the drains of the switches 452, 454 can be coupled to the sampling circuit 130 at an input node 422. The bootstrap circuit 402 and the switching circuit 450 can be duplicated and implemented for connection to an input node 424 and the sampling switch 135 of the sampling circuit 130. This can enable the circuit 400 to concurrently sample more than one signal at once. In some embodiments, the circuit 400 can sample both the signal S1 and the signal S2 using a separate switching circuit 450, 451 and bootstrap circuit 402, 403, similar to that described above. In some embodiments, the circuit 400 can have a number of nodes 422, 424 that is equivalent to a number of switching circuits 450, 451 and bootstrap circuits 402, 403.

In some embodiments, a bootstrap circuit 403 can be coupled to the input node 424 and provide a boosted voltage Vg' similar to the bootstrap circuit 402 and the boosted voltage Vg. The bootstrap circuit 403 can be coupled to the circuit 400 at the nodes 470 and 472, where FIG. 4A joins FIG. 4B.

In some embodiments, the circuit 400 can also have a switching circuit 451 coupled between the bootstrap circuit 403 and the sampling circuit 130. The structure and function of the bootstrap circuit 403 can be similar to that of the bootstrap circuit 402. Similarly, the switching circuit 451 can be similar to the switching circuit 450. The switching circuit 451 can have a pair of switches 453, 455 similar to the switches 452 and 454. Similar to above, the sources of the switches 453, 455 can be coupled to an output of the bootstrap circuit 403 (e.g., at the source of switch m8). Further, the drains of the switches 453, 455 can be coupled to the sampling circuit 130 at the input node 424.

The bootstrap circuit 402 can further have inputs 412, 414. Similarly, the bootstrap circuit 403 can further have inputs 413, 415. The inputs 412, 413, 414, 415 can be operable to receive an early sample phase (Pse) signal and an early hold phase (Phe) signal. The input 412, 414 and the inputs 413, 415 can be further respectively coupled to the switching circuits 450, 451. In some embodiments, the input 412 can be operably coupled to the gate of the switch 452. Similarly, the input 414 can be operably coupled to the gate of the switch 454. In a similar manner, the input 413 can be coupled to the gate of the switch 453 and the input 415 can be coupled to the gate of the switch 455.

The Pse signal and the Phe signal can be non-overlapping signals, similar to the Ps signal and the Ph signal, in that the Pse and Phe signals are never at "high" values or "on" at the same time. However, as described below, the Pse signal and the Phe signal have a shorter period than the Ps signal and the Ph signal. The Pse signal and the Phe signal can be used to control the operation of the switching circuit 450. Thus the switching circuit 450 can be turned on and off according to the Pse signal and the Phe signal. Accordingly, the switching circuit 450 can be turned on after the bootstrap circuit 402 is activated and turn off before the bootstrap circuit 402 is deactivated. This can control the connection of the input nodes 422, 424 to the bootstrap circuit 402, 403 based on the applied signals (e.g., Pse signal and the Phe signal). Thus the switching circuits 450, 451 can selectively isolate or decouple the input nodes 422, 424, reducing or eliminating the shorting currents that occur during the times Δt2 and the Δt3 of FIG. 2.

Figure 5:
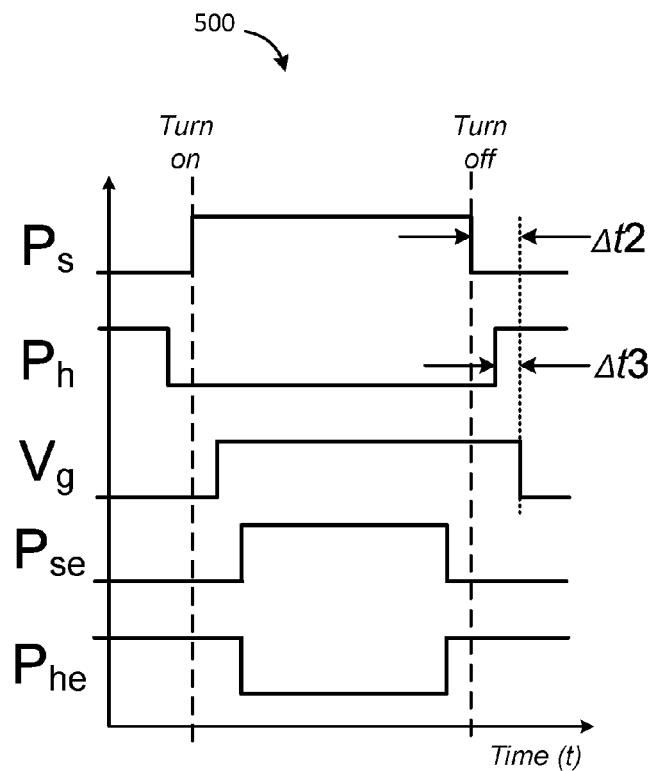
FIG. 5 is a timing diagram of exemplary clock signals of the sample and hold circuit of FIG. 4.

FIG. 5 is a timing diagram of exemplary clock signals of the sample and hold circuit of FIG. 4. The Ps signal, the Ph signal, the boosted voltage Vg, the Pse signal, and the Phe signal, are plotted in a timing diagram 500 over time. Time (t) is shown on the horizontal (x) axis. Each of the represented signals is shown as a digital signal with "high" and "low" values. In some embodiments, the high value may be a digital value corresponding to a "1" (one). Similarly, the low value may be a digital value corresponding to a "0" (zero), for example.

In some embodiments, the Ps and Ph signals can be non-overlapping signals, as shown. Similarly, the Pse signal and the Phe signal are also non-overlapping signals with a shorter period, or duty cycle, than the corresponding Ps signal and the Ph signal. In some embodiments, the Ps signal and the Ph signal define a first period. Similarly, the Pse signal and the Phe signal define a second period that is shorter than the first period. For example, the rising edge of the Pse signal can come after rising edge of Vg, which is after the rising edge of Ps and the falling edge of Ph. This enables the switching circuit 450 (or the switching circuit 451) to active (e.g., turn on) after the bootstrap circuit 402 (Vg) is on. For example, the falling edge of the Pse signal can come before the falling edge of Ps, which is before the rising edge of Ph and the falling edge of Vg. This enables the switching circuit 450 to deactivate (e.g., turn off) before the bootstrap circuit 402 (Vg) is off. Since the switching circuit 450 is off during the time interval when Ps cycle is low and Vg is high, and during the time interval when Ph is high and Vg is high, the voltage spike at the point 352 (FIG. 3) is avoided. The switching circuit 450 can then activate (e.g., turn on) after the voltage Vg has stabilized.

In an embodiment, the Pse signal and the Phe signal can turn the switching circuit 450 off before the Ps, Ph, or Vg cycle again; thus the Pse and Phe cycle "early" in comparison to Ps, Ph, and Vg. This can further avoid the voltage spike (e.g., the shorting currents) at the point 354 (FIG. 3), indicated at the times Δt2 and Δt3. In this way, the switching circuit 450 can be used to selectively isolate the sampling circuit 130 from the shorting currents based on the early clock signals Pse and Phe. This can serve to prevent or minimize voltage spikes resulting from boosted voltage Vg, such as experienced in the Vin of the bootstrap circuit 140. Thus the path from the bootstrap circuit via the switching circuit 450 to the sampling circuit 130 can remove the shorting current from Vdd and Vss (ground) to the input signals S1 and S2. In some embodiments, the incorporation of the switching circuit 450 can reduce the largest harmonics of the high-resolution ADCs (e.g., the sampling circuit 130) by more than 10 decibels (dB).

Figure 6:
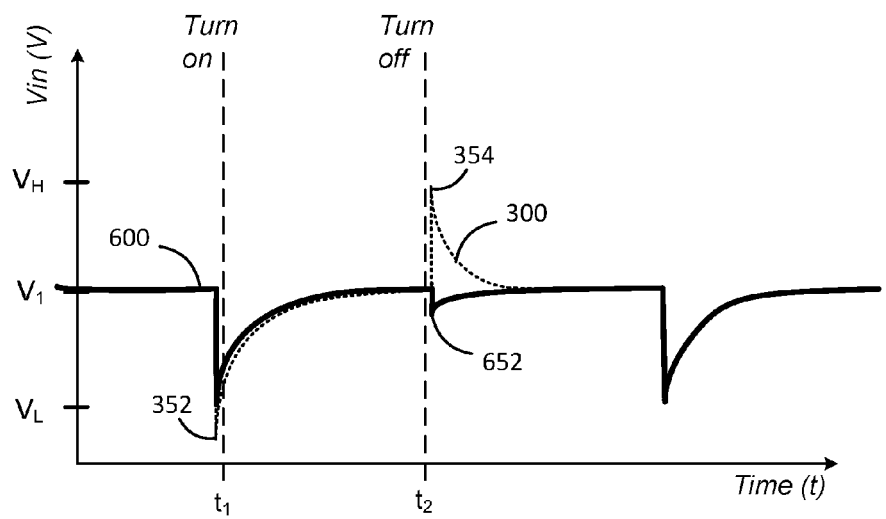
FIG. 6 is a graphical representation of the voltage over time at the input of the sampling circuit of FIG. 4.

FIG. 6 is a graphical representation of the voltage over time at the input of the sampling circuit of FIG. 4. A plot 600 shows the filtered signal Vin at the input node 422 is depicted as a solid line. The plot 300 (FIG. 3) is also depicted as a dotted line for comparison. The vertical (y) axis indicates volts, while time (t) is depicted on the horizontal (x) axis. The plot 600 depicts the minimized effect of the shorting currents from the input 422 to Vdd during Δt2 and the short from the input 422 to Vss during Δt3 as shown at point 652. Incorporation of the switching circuit 450, 452 between the bootstrap circuits 402, 403, respectively, and the sampling circuit 130 of the circuit 400 prevents the shorting currents to Vdd and Vss depicting FIG. 3. The switching circuit 450 turns on after the bootstrap circuit 402 is turned on. Additionally, the switching circuit 450 turns off before the bootstrap circuit 402 turns off. In this way the shorting current can be avoided as shown in the plot 600.

The above description of the disclosed embodiment is provided to enable any person skilled in the art to make or use the disclosure. Various modifications to these embodiments will be readily apparent to those skilled in the art, and the generic principles described herein can be applied to other embodiment without departing from the spirit or scope of the disclosure. Thus, it is to be understood that the description and drawings presented herein represent a presently preferred implementation of the disclosure and are therefore representative of the subject matter which is broadly contemplated by the present disclosure. It is further understood that the scope of the present disclosure fully encompasses other embodiment that may become obvious to those skilled in the art and that the scope of the present disclosure is accordingly limited by nothing other than the appended claims.

What is claimed is:

1. A device for analog to digital conversion having a supply voltage, the device comprising:
    a bootstrap circuit to provide a boosted voltage during a first period defined by a sample phase (Ps) signal and a hold phase (Ph) signal;
    a sampling circuit having an input node to sample an input signal supplied to the input node; and
    a switching circuit having a first switch and a second switch, the switching circuit operably coupled to the bootstrap circuit and to the sampling circuit, the switching circuit to isolate the input node from the supply voltage for a portion of the first period.

2. The device of claim 1, wherein the switching circuit is operable to isolate the input node from shorting currents to the supply voltage based on an early sample phase (Pse) signal supplied to the first switch and an early hold phase (Phe) signal supplied to the second switch, the Pse signal and the Phe signal being non-overlapping signals defining a second period shorter than the first period.

3. The device of claim 2,
    wherein the switching circuit is operable to couple the bootstrap circuit to the input node based on the second period, after the boosted voltage is activated based on the first period; and
    wherein the switching circuit is operable to decouple the bootstrap circuit from the input node based on the second period, before the boosted voltage is deactivated based on the first period.

4. The device of claim 2,
    wherein a source of the first switch and a source of the second switch are coupled to the bootstrap circuit, and
    wherein a drain of the first switch and a drain of the second switch are coupled to the input node of the sampling circuit.

5. The device of claim 2, wherein a gate of the first switch is operable to receive the Pse signal and a gate of the second switch is operable to receive the Phe signal.

6. The device of claim 2, wherein the Ps signal and the Ph signal are non-overlapping signals and are further configured to control application of the boosted voltage to a sampling switch of the sampling circuit, the sampling switch being configured to open when the boosted voltage is applied and allow the input signal to charge a sampling capacitor of the sampling circuit to retain a sampled voltage.

7. The device of claim 6, wherein when the boosted voltage is removed from the sampling switch based on the first period, the sampling switch is further configured to close in response to the removed boosted voltage and the sampling capacitor is configured to hold the sampled voltage.

8. The device of claim 1 further comprising an anti-aliasing filter (AAF) having a filtered output operably coupled to the input node to supply the input signal.

9. The device of claim 8 wherein an output of the switching circuit is coupled to the filtered output of the AAF and the input node of the sampling circuit.

10. The device of claim 1 wherein the sampling circuit is further configured to receive a plurality of input signals and wherein the device further comprises a number of bootstrap circuits and a number of switching circuits that is equivalent to a number of the plurality of input signals.

11. A method for analog to digital conversion in a sample and hold circuit having a supply voltage, the method comprising:
    receiving a sample phase (Ps) signal and a sample hold (Ph) signal at a bootstrap circuit, the Ps signal and the Ph signal defining a first period;
    providing, by the bootstrap circuit, a boosted voltage to a sampling circuit based on the first period; and
    isolating, with a switching circuit, an input node of the sampling circuit from shorting currents to the supply voltage for a portion of the first period.

12. The method of claim 11 further comprising, receiving an early sample phase (Pse) signal at a first switch of the switching circuit and an early hold phase (Phe) signal at a second switch of the switching circuit, the Pse signal and the Phe signal defining a second period shorter than the first period.

13. The method of claim 12 further comprising:
    activating the bootstrap circuit to provide the boosted voltage based on the Ps signal and the Ph signal;
    activating the switching circuit based the Pse signal and the Phe signal, and coupling the bootstrap circuit to the input node, after activating the bootstrap circuit;
    deactivating the switching circuit based the Pse signal and the Phe signal; and
    deactivating bootstrap circuit based on the Ps signal and the Ph signal after deactivating the switching circuit.

14. The method of claim 12, the switching circuit comprising a first switch and a second switch,
    wherein a source of the first switch and a source of the second switch are coupled to the bootstrap circuit, and
    wherein a drain of the first switch and a drain of the second switch are coupled to the input node of the sampling circuit.

15. The method of claim 12, wherein a gate of the first switch is operable to receive in the Pse signal and the gate of the second switch is operable to receive the Phe signal.

16. The method of claim 12 further comprising:
    opening a sampling switch of the sampling circuit based on the first period;
    charging a sampling capacitor with a filtered signal at the input node of the sampling circuit based on the opening;
    closing the sampling switch based on the first period; and
    holding a charge based on the filtered signal by the sampling capacitor.

17. The method of claim 16, further comprising:
    amplifying an input signal; and
    filtering the input signal with an anti-aliasing filter (AAF) to provide the filtered signal to the input node of the sampling circuit.

18. The method of claim 17, wherein an output of the switching circuit is coupled to the output of the AAF and the input node of the sampling circuit.

19. The method of claim 11, wherein the Ps signal and the Ph signal are non-overlapping signals, and wherein the Pse signal and the Phe signal are non-overlapping signals.

20. An apparatus for analog to digital conversion having a supply voltage, the apparatus comprising:
    means for receiving a sample phase (Ps) signal and a sample hold (Ph) signal, the Ps signal and the Ph signal defining a first period;
    means for sampling a filtered signal based at least in part on the first period;
    means for providing a boosted voltage to the means for sampling based on the first period; and means for isolating an input node of the means for sampling from shorting currents to the supply voltage for a portion of the first period based on a second period.

21. The apparatus of claim 20, wherein the means for providing is a bootstrap circuit and the means for isolating is a switching circuit.

22. The apparatus of claim 20, wherein the means for isolating is configured to receive an early sample phase (Pse) signal and an early hold phase (Phe) signal, the Pse signal and the Phe signal defining the second period.

23. The apparatus of claim 20,
wherein the means for sampling is configured to sample the filtered signal based on the first period, and
wherein the means for isolating is configured to activate after the first period starts and deactivate before the first period ends.

24. The apparatus of claim 20 wherein the means for isolating isolates the input node based at least in part on the second period.

25. The apparatus of claim 20 further comprising:
means for amplifying an input signal; and
means for filtering the input signal to provide the filtered signal to the input node of the means for sampling.

26. A device for sampling one or more signals and having a supply voltage, the device comprising:
a sampling circuit configured to sample one or more filtered signals received at one or more input nodes of the sampling circuit, the sampling circuit having one or more sampling switches configured to receive a boosted voltage, a number of the one or more sampling switches being equal to a number of the one or more filtered signals;
one or more bootstrap circuits operably coupled to the supply voltage and to the one or more switches, the one or more bootstrap circuits configured to provide a boosted voltage to the one or more sampling switches based on a first period defined by a sample phase (Ps) signal and a sample hold (Ph) signal;
one or more switching circuits operably coupled to the one or more bootstrap circuits and the one or more input nodes, the one or more switching circuits configured to isolate the one or more input nodes from the supply voltage for a second period shorter than the first period, the second period being defined by an early sample phase (Pse) signal and an early hold phase (Phe) signal.

27. The device of claim 26, wherein each switching circuit of the one or more switching circuits comprises at least a first switch and a second switch,
wherein a source of the first switch and a source of the second switch are coupled to a bootstrap circuit of the one or more bootstrap circuits,
wherein a drain of the first switch and a drain of the second switch are coupled to the sampling circuit, and
wherein a gate of the first switch is operable to receive the Pse signal and a gate of the second switch is operable to receive the Phe signal.

28. The device of claim 26, wherein the Ps signal and the Ph signal are non-overlapping signals and are further configured to control application of the boosted voltage to the one or more sampling switches of the sampling circuit, the one or more sampling switches being configured to open when the boosted voltage is applied and allow the one or more filtered signals to charge a sampling capacitor of the sampling circuit.

29. The device of claim 28, wherein when the boosted voltage is removed from the one or more sampling switches based on the Ps signal and the Ph signal, the one or more sampling switches are further configured to close in response to the removed boosted voltage and the sampling capacitor is configured to retain a sampled voltage.

30. The device of claim 26, wherein the one or more switching circuits are configured to activate after the one or more bootstrap circuits provide the boosted voltage at a beginning of the first period, and the one or more switching circuits are further configured to deactivate after the one or more bootstrap circuits deactivate the boosted voltage based on an end of the first period.

* * * * *